United States Patent
Hougham et al.

(10) Patent No.: US 7,452,212 B2
(45) Date of Patent: Nov. 18, 2008

(54) METALIZED ELASTOMERIC ELECTRICAL CONTACTS

(75) Inventors: Gareth Geoffrey Hougham, Ossining, NY (US); Ali Afzali, Ossining, NY (US); Steven Allen Cordes, Yorktown Heights, NY (US); Paul W. Coteus, Yorktown, NY (US); Matthew J. Farinelli, Riverdale, NY (US); Sherif A. Goma, White Plains, NY (US); Alphonso P. Lanzetta, Marlboro, NY (US); Daniel Peter Morris, Purchase, NY (US); Joanna Rosner, Cortlandt Manor, NY (US); Nisha Yohannan, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/718,279

(22) PCT Filed: Sep. 30, 2005

(86) PCT No.: PCT/US2005/035324

§ 371 (c)(1),
(2), (4) Date: Apr. 30, 2007

(87) PCT Pub. No.: WO2007/001391

PCT Pub. Date: Jan. 4, 2007

(65) Prior Publication Data

US 2007/0298626 A1    Dec. 27, 2007

Related U.S. Application Data

(60) Provisional application No. 60/636,666, filed on Dec. 16, 2004.

(51) Int. Cl.
*H01R 9/00*    (2006.01)
(52) U.S. Cl. .......................................... 439/66; 439/91
(58) Field of Classification Search ................... 439/66, 439/91, 591
See application file for complete search history.

(56) References Cited

U.S. PATENT DOCUMENTS

| 5,071,359 | A | | 12/1991 | Arnio et al. |
| 5,244,143 | A | | 9/1993 | Ference et al. |
| 5,371,654 | A | | 12/1994 | Beaman et al. |
| 5,476,211 | A | * | 12/1995 | Khandros ................ 228/180.5 |
| 5,531,022 | A | | 7/1996 | Beaman et al. |
| 5,635,846 | A | | 6/1997 | Beaman et al. |
| 5,776,587 | A | | 7/1998 | Angelopoulos et al. |
| 5,821,763 | A | | 10/1998 | Beaman et al. |
| 5,917,707 | A | * | 6/1999 | Khandros et al. ........... 361/776 |
| 6,054,651 | A | | 4/2000 | Fogel et al. |

(Continued)

FOREIGN PATENT DOCUMENTS

WO    WO98/11449    3/1998

(Continued)

*Primary Examiner*—Gary F. Paumen
(74) *Attorney, Agent, or Firm*—Ido Tuchman; Ryan, Mason & Lewis, LLP

(57) ABSTRACT

Techniques for forming enhanced electrical connections are provided. In one aspect, an electrical connecting device comprises an electrically insulating carrier having one or more contact structures traversing a plane thereof. Each contact structure comprises an elastomeric material having an electrically conductive layer running along at least one surface thereof continuously through the plane of the carrier.

1 Claim, 14 Drawing Sheets

U.S. PATENT DOCUMENTS

| | | | |
|---|---|---|---|
| 6,062,879 | A | 5/2000 | Beaman et al. |
| 6,104,201 | A | 8/2000 | Beaman et al. |
| 6,110,823 | A | 8/2000 | Eldridge et al. |
| 6,146,151 | A | 11/2000 | Li |
| 6,149,840 | A | 11/2000 | Ardakani et al. |
| 6,286,208 | B1 | 9/2001 | Shih et al. |
| 6,295,729 | B1 | 10/2001 | Beaman et al. |
| 6,329,827 | B1 | 12/2001 | Beaman et al. |
| 6,336,269 | B1 * | 1/2002 | Eldridge et al. ............... 29/885 |
| 6,442,039 | B1 | 8/2002 | Schreiber |
| 6,452,406 | B1 | 9/2002 | Beaman et al. |
| 6,528,984 | B2 | 3/2003 | Beaman et al. |
| 6,624,648 | B2 | 9/2003 | Eldridge et al. |
| 6,708,872 | B2 | 3/2004 | Gruber et al. |
| 2001/0020545 | A1 * | 9/2001 | Eldridge et al. ............. 174/260 |
| 2001/0020546 | A1 * | 9/2001 | Eldridge et al. ............. 174/261 |
| 2002/0117330 | A1 * | 8/2002 | Eldridge et al. ............. 174/260 |
| 2004/0203262 | A1 | 10/2004 | Lindsey et al. |
| 2005/0106902 | A1 | 5/2005 | Hougham et al. |
| 2006/0046528 | A1 | 3/2006 | Beaman et al. |
| 2008/0094085 | A1 * | 4/2008 | Hougham et al. ........... 324/754 |

FOREIGN PATENT DOCUMENTS

WO  PCT/US0535324  9/2007

* cited by examiner

METALIZED ELASTOMERIC ELECTRICAL CONTACTS

CROSS REFERENCE TO RELATED APPLICATION(S)

This application claims the benefit of U.S. Provisional Application No. 60/636,666, filed on Dec. 16, 2004, the disclosure of which is incorporated by reference herein.

STATEMENT OF GOVERNMENT RIGHTS

This invention was made with Government support under Contract PERCS II, NBCH3039004 awarded by the Defense Advanced Research Projects Agency (DARPA) of the United States Department of Defense. The Government has certain rights in this invention.

FIELD OF THE INVENTION

The present invention relates to electrical connections and, more particularly, to improved techniques for electrically connecting two or more surfaces.

BACKGROUND OF THE INVENTION

Land grid arrays (LGAs) which typically comprise a plurality of contacts, are commonly employed as interposers between components of electronic devices. For example, an LGA may be present between a two-dimensional array of metal pads on a chip module and corresponding metal pads on a printed wiring board (PWB), also referred to as a printed circuit board (PCB), wherein the contacts of the LGA conduct electrical signals from the chip module to the PWB.

When LGAs are employed, proper electrical conductivity is an important consideration. Namely, electrical signals must be conducted by the LGA with high integrity and be able to accommodate significant amperage. In many applications, this poses a considerable challenge. For instance, most chip modules and PWBs are not perfectly planar, with their dimensions tending to be application specific. Dimensions may also vary from one LGA to another LGA. These dimensional variations make forming a proper electrical connection across all contacts of a conventional LGA difficult, if at all possible.

Accordingly, there exists a need for techniques for electrically connecting surfaces, particularly non-planar surfaces, which do not suffer from one or more of the problems exhibited by conventional electrical connection methodologies.

SUMMARY OF THE INVENTION

The present invention meets the above-noted need by providing, in an illustrative embodiment, techniques for forming enhanced electrical connections for electrically connecting two or more surfaces, particularly non-planar surfaces. In accordance with one aspect of the invention, an electrical connecting device is provided which includes an electrically insulating carrier having one or more contact structures traversing a plane thereof. Each contact structure comprises an elastomeric material having an electrically conductive layer running along at least one surface thereof continuously through the plane of the carrier.

A coaxial electrical connection may be provided, in accordance with an embodiment of the invention, by forming an insulating layer on at least a portion of the electrically conductive layer and running continuously through the plane of the carrier, and forming a second electrically conductive layer (e.g., metal layer) on at least a portion of the insulating layer and running continuously through the plane of the carrier. The second electrically conductive layer can be connected to a common signal ground.

In accordance with another aspect of the invention, a method of forming an electrical connecting device includes the steps of: depositing an elastomeric material on an electrically insulating carrier; and metallizing the elastomeric material so as to form an electrically conductive layer running continuously through a plane of the carrier and along a surface of the elastomeric material.

In accordance with yet another aspect of the invention, a land grid array interposer connector device includes an electrically insulating carrier having one or more contact structures traversing a plane thereof, each contact structure comprising an elastomeric material having an electrically conductive layer running along at least one surface thereof continuously through the plane of the carrier.

These and other features and advantages of the present invention will become apparent from the following detailed description of illustrative embodiments thereof, which is to be read in connection with the accompanying drawings.

DETAILED DESCRIPTION OF THE INVENTION

All of the following disclosures are incorporated herein by reference: U.S. application Ser. No. 09/254,769 filed on Mar. 11, 1999, which is the U.S. National Phase of International Application Serial No. PCT/US97/16264 filed on Sep. 12, 1997, which claims priority to U.S. Provisional Application Ser. No. 60/026,088 filed on Sep. 13, 1996; U.S. application Ser. No. 09/254,768 filed on Mar. 11, 1999, which issued as U.S. Pat. No. 6,528,984 on Mar. 4, 2003, which is the U.S. National Phase of International Application Ser No. PCT/US97/16265 filed on Sep. 12, 1997, which claims priority from U.S. Provisional Application Ser. No. 60/026,088 filed on Sep. 13, 1996; U.S. application Ser. No. 09/254,798 filed on Mar. 11, 1999, which issued as U.S. Pat. No. 6,452,406 on Sep. 17, 2002, which is the U.S. National Phase of International Application Ser No. PCT/US97/13698 filed on Sep. 12, 1997, which claims priority from U.S. Provisional Application Ser. No. 60/026,050 filed on Sep. 13, 1996; U.S. application Ser. No. 08/756,831 filed on Nov. 20, 1996, which is a Continuation of U.S. application Ser. No. 08/425,639 filed on Apr. 20, 1995, now abandoned; U.S. Pat. Nos. 5,821,763; 6,062,879; 6,295,729; 6,329,827; 6,286,208; 6,054,651; 6,104,201; and 5,531,022.

The present invention will be described herein in the context of illustrative electrical contact structures. It should be understood, however, that the present invention is not limited to these or any other particular electrical contact structures. Rather, the invention is more generally applicable to techniques for providing an enhanced electrical connection between two or more surfaces. Although implementations of the present invention are described herein with specific reference to LGA interposer connectors and exemplary methods for forming the same, it is to be understood that the invention is not limited to such an application and/or such a fabrication methodology, and that other suitable applications, such as, for example, semiconductor probing, etc., and/or fabrication techniques, may be similarly employed, as will become apparent to those skilled in the art.

Figure 1:
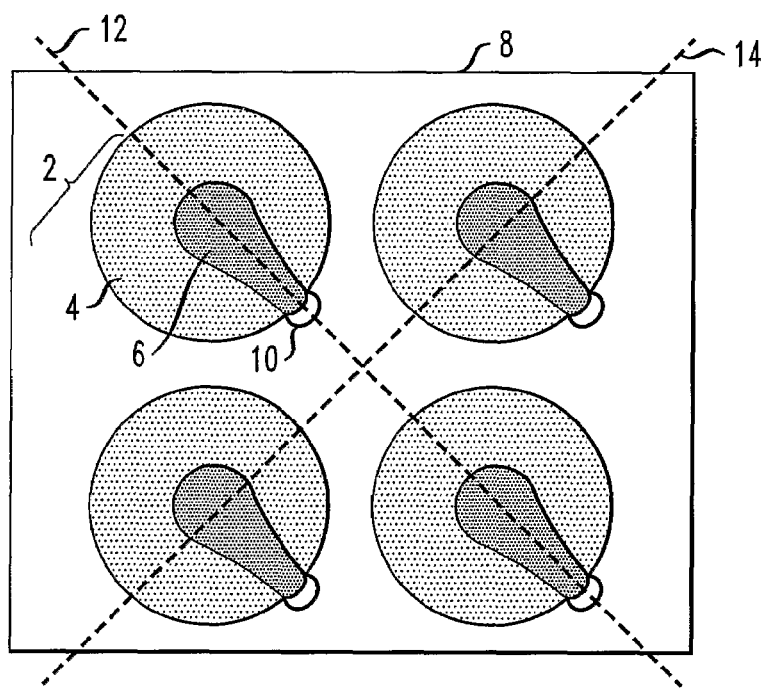
FIG. 1 is a top-down view depicting an exemplary array of electrical contacts, formed in accordance with an illustrative embodiment of the present invention.

FIG. 1 is a diagram illustrating a top-down view of an exemplary array of electrical contacts. By way of example only, the two-by-two (2×2) array of electrical contacts shown in FIG. 1 may constitute a land grid array (LGA) interposer connector. Interposers with electrical contacts are described, for example, in U.S. patent application Ser. No. 10/715,288, filed Nov. 17, 2003, entitled "Interposer With Electrical Contact Button and Method," the disclosure of which is incorporated by reference herein. Each electrical contact, for example, contact 2, comprises an elastomeric bump 4, e.g., comprising an elastic rubber. As will be described in conjunction with the description of FIG. 2, below, there exists a similar corresponding elastomeric bump on a side of carrier 8 opposite elastomeric bump 4.

Employing an LGA interposer connector having elastomeric contacts provides several notable benefits. For example, to achieve proper conductivity, LGA interposer connectors are typically held in place under pressure, such as being sandwiched between connected surfaces, under force supplied, for example, by a spring and actuating hardware. However, since the connected surfaces, for example, a chip module and a printed wiring board (PWB), are typically not perfectly planar, the force experienced by some contacts on the LGA interposer connector will be greater than that experienced by others. Because of the deformable, yet resilient, nature of elastomeric materials, elastomeric contacts are well-suited to accommodate these force variations and ensure proper conductivity across all contacts.

The elastomeric contacts may comprise any suitable elastomeric material, including, but not limited to, polydimethyl siloxane (PDMS) rubber, silicon rubber and combinations comprising at least one of the foregoing elastomeric materials. According to an exemplary embodiment, one or more of the elastomeric bumps comprise PDMS rubber and are formed by photopolymerizing the siloxane precursors.

In addition to the rubber compounds mentioned above, other elastomeric materials may be suitable for forming the elastomeric bumps. These materials include, but are not limited to, polyurethane, epoxy, butadiene containing polymers and combinations comprising at least one of the foregoing elastomeric materials.

An exemplary method for forming the elastomeric bumps in accordance with the invention will be described herein below, in conjunction with the description of FIG. 15.

Elastomeric bump 4 comprises metal layer 6, or an alternative electrically conductive layer, on an outer surface thereof. Specifically, as will be described in further detail in conjunction with the description of FIG. 2 below, metal layer 6 is preferably continuous from a top, or peak, of elastomeric bump 4 to a peak of the opposing elastomeric bump on the opposite face of carrier 8, e.g., from a source side to a terminal side of the LGA. Preferably, metal layer 6 extends continuously between the most distant points of the elastomeric bumps. An opening (e.g., opening 10 in carrier 8) allows metal layer 6 to extend without interruption between the peaks of the elastomeric bump 4 on opposing sides of the carrier 8.

Metal layer 6 will have good adhesion to the elastomeric material and be mechanically durable, e.g., against cracking, by some combination of elasticity and ductility. Thus, when a contact is compressed, for example, between a chip module and a PWB, as described above, the metal layer 6 first makes contact to the module and PWB, and then is compressed further until such force has been applied for all contacts across the array to make contact. As a result, some contacts will be compressed further than others because of camber and other topographical distortions of the connected surfaces away from perfect planarity.

Metal layer 6 preferably comprises any metal suitable for effectively conducting electricity, including, but not limited to, copper, gold, nickel-titanium alloy and combinations comprising at least one of the foregoing metals. Further, metal layer 6 may be applied, i.e., elastomeric bump 4 may be metallized, by any suitable metal deposition technique, including, but not limited to, sputtering, evaporating, electroplating, electroless plating and combinations comprising at least one of the foregoing metal deposition techniques.

By way of example only, blanket metallization techniques may be employed to apply metal layer 6. Specifically, metal layer 6 may be applied by blanket metallizing all exposed surfaces by electroplating to a sufficient thickness of, for example, copper. The electroplating is preferably followed by the application of a photoresist and the subsequent exposure of the photoresist, e.g., by light, through a photomask. The photoresist is developed, exposing the areas desired to be etched away.

Unwanted metal material may then be etched away from carrier 8. Following etching, unwanted photoresist can then be removed from each elastomeric bump 4, leaving only a strip of metal of a desired geometry, e.g., from the top of elastomeric bump 4, continuously down the side of elastomeric bump 4, through opening 10, to the peak of the elastomeric bump on the other side of carrier 8 (not shown).

Metal layer 6 may then optionally be coated by selective electroless plating, for example, with gold, to impart corrosion resistance to the contact. Alternatively, metal layer 6 may be coated by other selective metallization processes, including, but not limited to, electroplating, using other metals, including, but not limited to nickel.

According to another exemplary embodiment, metal layer 6 is applied using a solid mask with openings positioned above areas of the elastomeric bumps requiring metallization. The material used to form metal layer 6 is then applied using conventional deposition techniques, including, but not limited to, sputtering, evaporating, plating, spraying (e.g., a metal-containing solution, for example, a solution containing a seed compound, such as tin or palladium, for subsequent plating) and combinations comprising at least one of the foregoing application techniques.

Further, these conventional deposition techniques, namely, sputtering, evaporating, plating and spraying, may be used to selectively apply metal layer 6 onto the elastomeric bumps by applying the material used to form metal layer 6, e.g., at one or more angles relative to a primary axis of the elastomeric bump, so as to result in metal layer 6 being deposited on only selected regions of the elastomeric bump. This selective deposition may be conducted with or without a solid mask. For example, the material used to form metal layer 6 may be sprayed onto the elastomeric bumps at an angle (e.g., from a side) so as to result in metal layer 6 being deposited substantially on that side of the elastomeric bumps only.

According to yet another exemplary embodiment, selective plating techniques are used to metallize the elastomeric bumps. Specifically, metal layer 6 is applied by exposing the elastomeric bumps, in mass, to a seed compound which has selective attraction, adsorption or absorption onto, or into, the elastomeric material. Suitable seed compounds include, but are not limited to, phenylphosphene containing compounds, polyphosphene, platinum, palladium, tin, tin salts and combinations comprising at least one of the foregoing compounds, in either a pure liquid form or in solution. For example, phenylphosphene containing compounds will absorb into PDMS and are known to bind traditional palladium-tin colloidal catalyst systems for the electroless deposition of copper, nickel and other metals.

Further, phenylphosphine systems could be covalently bound into the siloxane crosslinked network of the elastomeric bumps to maximize adhesion of the plated metal layers. The result would be an elastomeric bump that was completely encased in metal, which would provide a different balance of advantages and disadvantages in both mechanical and electrical performance.

The array may then be exposed, in mass, to an electroless plating bath. The "seeded" elastomeric bumps, but not the carrier, would then become metallized. Further, as mentioned above, photoresist and etching can be employed to remove any unwanted portions of the metallurgy from the elastomeric bumps.

Alternatively, the elastomeric bump may first be selectively plated, e.g., by the above techniques, followed by photoresist being deposited over the plating, e.g., by spin-on deposition. The photoresist can then be photodeveloped and unwanted portions of the metallization removed. This could result in a desired pattern on the elastomeric bump (as opposed to a full metal encasement) and at the same time provide a wet process means of seeding for electroless deposition which is typically less costly than sputtering and evaporation techniques. In contrast, the blanket plating techniques, described above, typically would require a sputter deposition of adhesion and seed layers.

According to a further exemplary embodiment, photoresist is first applied to the array and then developed to form the desired metallization patterns. The material used to form metal layer 6 can then be deposited in mass on the array, e.g., by sputtering, evaporating or a combination thereof. The remaining photoresist can then be removed, removing unwanted portions of the metallurgy with it.

Figure 2:
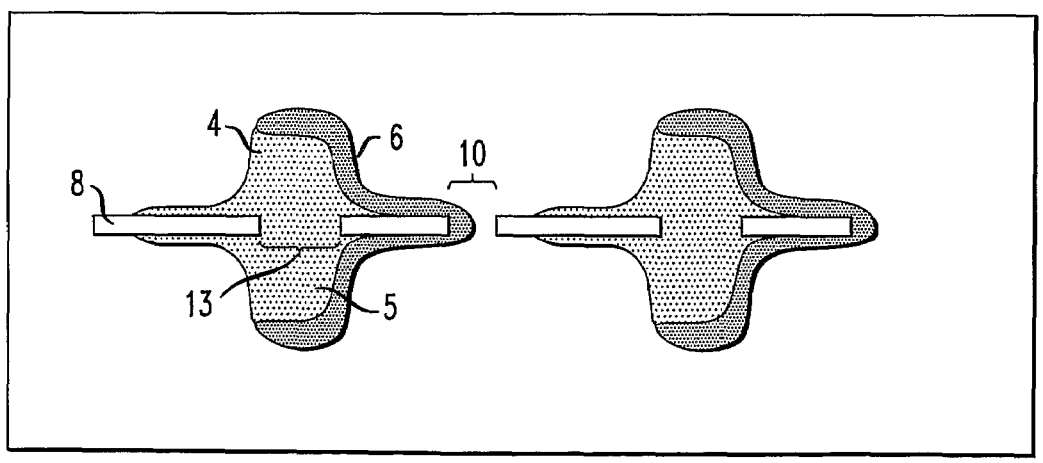
FIG. 2 is a cross-sectional view of the array of electrical contacts shown in FIG. 1, according to an embodiment of the present invention.

Dashed line 12 indicates the path of a cross-sectional view of the array shown in FIG. 2. Dashed line 14 indicates the path of a cross-sectional view of the array shown in FIG. 3.

FIG. 2 is a diagram illustrating a cross-sectional view of the array of electrical contacts shown in FIG. 1, e.g., along dashed line 12. FIG. 2 illustrates that elastomeric bump 4 has a corresponding elastomeric bump 5 extending out from a side of carrier 8 opposite to elastomeric bump 4. According to this configuration, the pair of elastomeric bumps, e.g., elastomeric bump 4 and elastomeric bump 5, extends continuously above and below the plane of carrier 8, e.g., through openings 10 and 13 in carrier 8. This pair of elastomeric bumps, e.g., elastomeric bumps 4 and 5, with the associated metal layer, e.g., metal layer 6, comprises a single electrical contact.

As was similarly described above in conjunction with the description of FIG. 1 relating to metal layer 6, opening 13 allows the elastomeric material to pass continuously through carrier 8. Thus, elastomeric bumps exist in positive relief on two opposing sides of the carrier.

A suitable starting material for carrier 8 includes, but is not limited to, a perforated electrically insulating material, such as a perforated ceramic or plastic sheet, for example, a Kapton polyimide sheet (manufactured by E.I. du Pont de Nemours and Company, Circleville, Ohio), or a woven glass sheet. In the carrier, openings 13 may be punched or laser drilled in a regular pattern, such as a two-dimensional array on a one millimeter pitch. Another pattern of openings 10, on the same pitch, may then be superimposed on the pattern of openings 13, but shifted in position, for example, by about one radius (as may be defined by the distance from the center of an elastomeric bump to its outer edge).

The carrier with the two arrays of openings is then placed into a mold and PDMS is injection or transfer molded, into relief features that extend both above and below the plane of the carrier. The shapes of the elastomeric bumps may also be tailored based on the particular application. For example, the heights of the elastomeric bumps may be varied. Further, the elastomeric bumps may be formed as conical sections (e.g., having a flat top and bottom). Alternatively, the elastomeric bumps may be formed having rounded tops or multi-pointed tops. Rounded tops are advantageous, e.g., as compared to flat tops, as they provide a smooth continuous surface for metallization. Multi-pointed tops are advantageous as they provide multiple points of contact and serve to focus the force applied to contacts produced therefrom.

An important feature of the present invention is that the elastomeric material extends only partially (e.g., halfway) across opening 10. This feature is shown illustrated, for example, in FIG. 2. In this manner, a smooth continuous surface that always interfaces with air will extend from the very top of elastomeric bump 4, down one side thereof, through opening 10 in carrier 8 and along one side of elastomeric bump 5, on the other side of carrier 8, to a peak thereof. It is to be expected, however, that deposited metal layer 6 may extend the rest of the way across, and effectively plug opening 10. This occurrence does not effect the functioning of the contact.

It should be noted from the depiction in FIG. 2 that elastomeric bumps 4 and 5 are substantially axially centered over opening 13. While the teachings presented herein should not be construed as being limited to the elastomeric bumps being substantially axially centered over the opening in the carrier, having such a configuration might be advantageous. For example, axially centering the elastomeric bump over the opening in the carrier may be useful for material transfer during the molding process and to ensure proper anchoring of the elastomeric bump to the carrier.

The electrical conductivity of an elastomeric bump according to the present invention, such as, for example, elastomeric bump 4 depicted in FIG. 1, can be beneficially increased as desired by using an elastomeric material filled with electrically conductive particles (e.g., metal particles). Alternatively, an elastomeric material which is filled with an inherently electrically conductive polymer may be employed. Electrically conductive polymers suitable for use with the present invention are described, for example, in U.S. Pat. Nos. 6,149,840 and 5,776,587, the disclosures of which are incorporated herein by reference.

Figure 3:
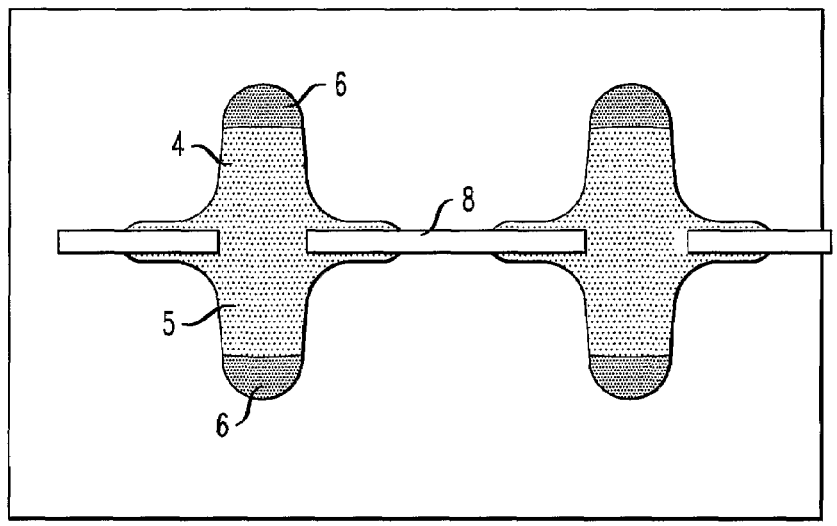
FIG. 3 is another cross-sectional view of the array of electrical contacts shown in FIG. 1, according to an embodiment of the present invention.

FIG. 3 is a diagram illustrating another cross-sectional view of the array of electrical contacts shown in FIG. 1, e.g., along dashed line 14. FIG. 3 illustrates that metal layer 6 exists on both the peaks of elastomeric bumps 4 and 5.

Figure 4:
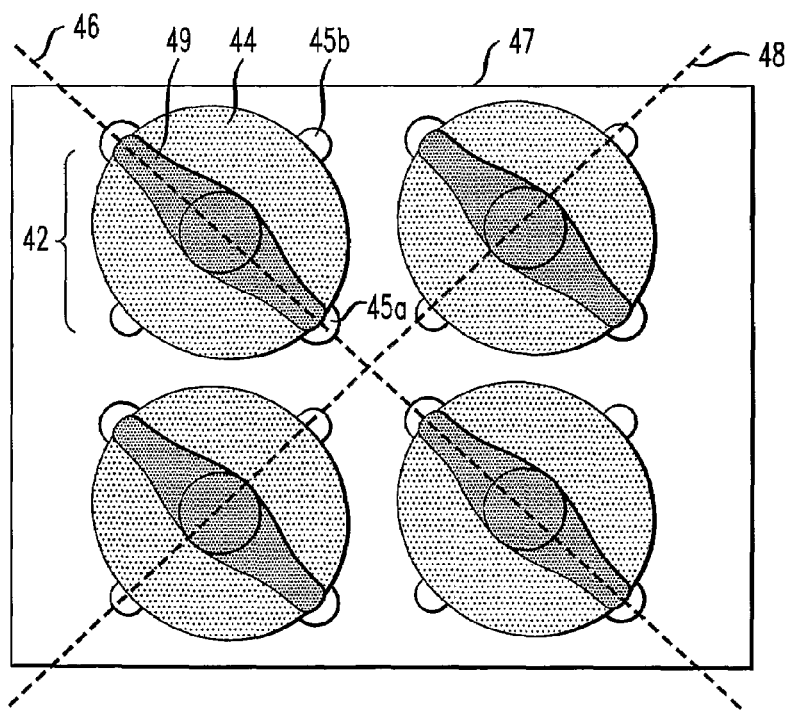
FIG. 4 is a top-down view depicting an exemplary array of electrical contacts, formed in accordance with another embodiment of the present invention.

FIG. 4 is a diagram illustrating a top-down view of another exemplary array of electrical contacts. Each electrical contact, for example, contact 42, comprises an elastomeric bump 44, which, as described above, is continuous with a corresponding elastomeric bump on an opposing side of carrier 47. Elastomeric bump 44 comprises metal layer 49. In contrast to the configurations shown in FIGS. 1-3, the electrical contacts in FIG. 4 are formed using only openings in the carrier existing at the outer edges of the contact, e.g., openings 45a and 45b, to transfer material from one side of the carrier to the other. Thus, openings in the carrier proximal to the axial center of each elastomeric bump, e.g., opening 13 in FIG. 2, described above, are not needed.

According to the embodiment shown in FIG. 4, opening 45a acts as a conduit for the formation of metal layer 49 and has a function similar to opening 10 in FIG. 2, described above. Opening 45b acts as a conduit for the elastomeric material used to form elastomeric bump 44. Opening 45b serves no electrical purpose. For example, it does not function in the formation of the metal layer. However, opening 45b does serve to anchor elastomeric bump 44 to carrier 47. As such, configurations are contemplated herein having multiple openings e.g., 45a and 45b, and not having an opening centered under elastomeric bump 44.

Figure 5:
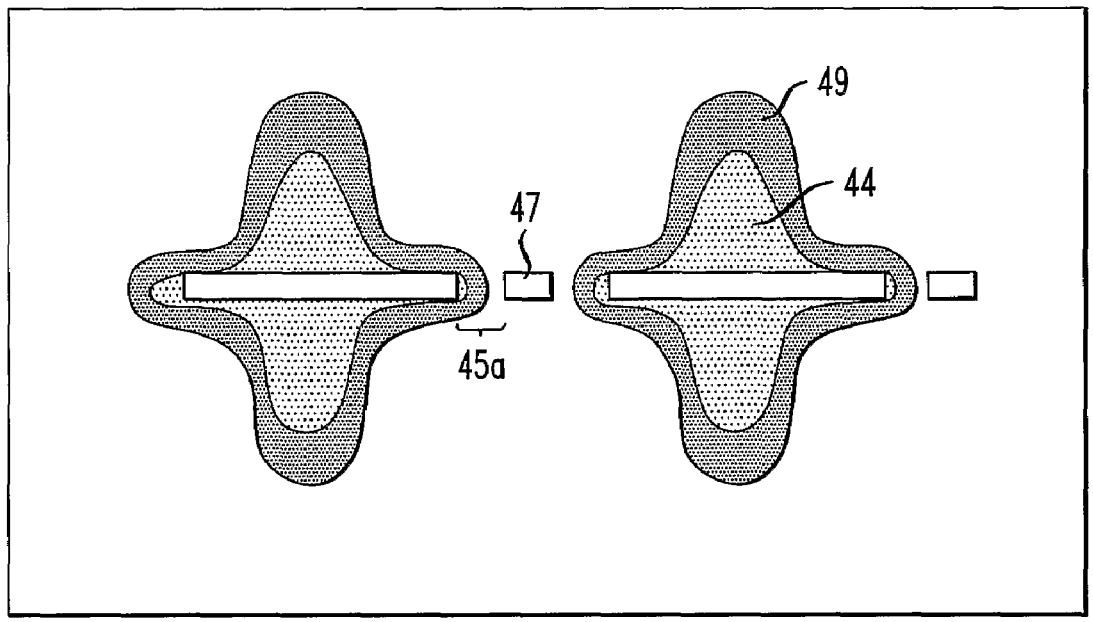
FIG. 5 is a cross-sectional view of the array of electrical contacts shown in FIG. 4, according to an embodiment of the present invention.

Dashed line 46 indicates the path of a cross-sectional view of the array shown in FIG. 5. Dashed line 48 indicates the path of a cross-sectional view of the array shown in FIG. 6.

Another feature illustrated in FIG. 4 is that, since there are two openings which serve as conduits for formation of the metal layer, e.g., opening 45a, two opposing conducting metal lines are formed. Having such a configuration may be advantageous, as compared to a single non-symmetric conductor path. For example, having two conducting lines may enhance reliability and help control inductive contributions to signal integrity.

Further, the shape (e.g., width, path on the bump surface and thickness) of the metal layer may be modified to enhance performance. For example, the shape of the metal layer may be modified by choosing different photomask patterns. Other shapes, for example, conducting lines that wiggle (roughly a sinusoidal shape) from left to right on the surface of the elastomeric bump, as they make their way to the top and the bottom of the elastomeric bump, or that spiral, may have mechanical, as well as electrical, benefits in certain applications.

FIG. 5 is a diagram illustrating a cross-sectional view of the array of electrical contacts shown in FIG. 4, e.g., along dashed line 46. In contrast to the contact configuration shown, for example, in FIG. 2, and described above, FIG. 5 illustrates a metal layer (metal layer 49) which extends from the peak of elastomeric bump 44 down two opposing sides thereof, to form two conducting circuit lines.

Figure 6:
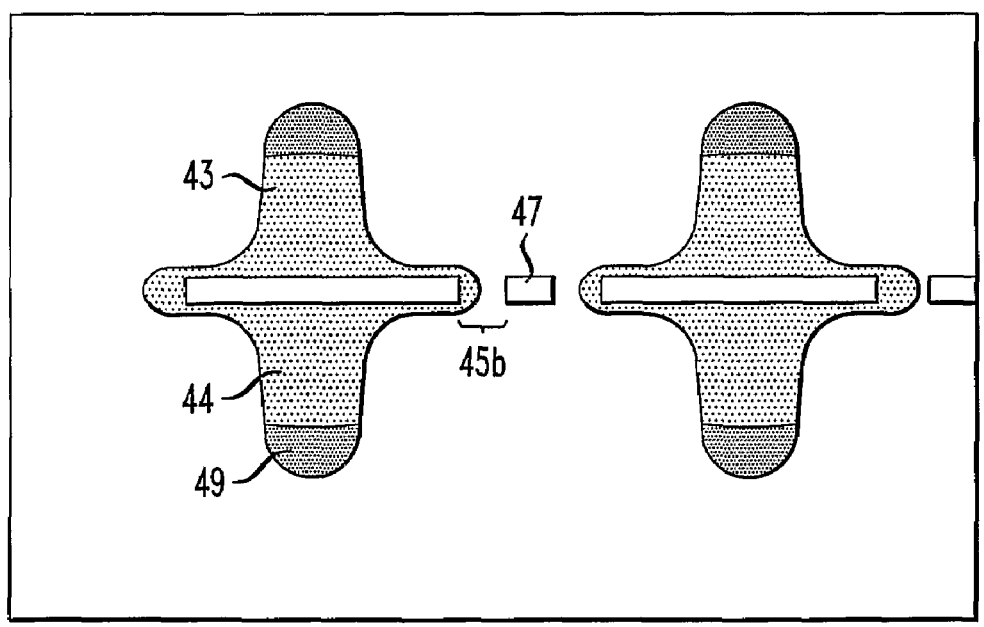
FIG. 6 is another cross-sectional view of the array of electrical contacts shown in FIG. 4, according to an embodiment of the present invention.

FIG. 6 is a diagram illustrating another cross-sectional view of the array of electrical contacts shown in FIG. 4, e.g., along dashed line 48. Similar to the contact configuration shown, for example, in FIG. 3, and described above, FIG. 6 illustrates that a metal layer, e.g., metal layer 49, exists on both peaks of elastomeric bumps 43 and 44. FIG. 6 further illustrates openings 45b existing on two sides of elastomeric bump 44. As highlighted above, these openings act as conduits for the elastomeric material when forming the elastomeric bump, and serve to anchor the elastomeric bump, once formed, to the carrier, e.g., they act as a mechanical connection point.

Figure 7:
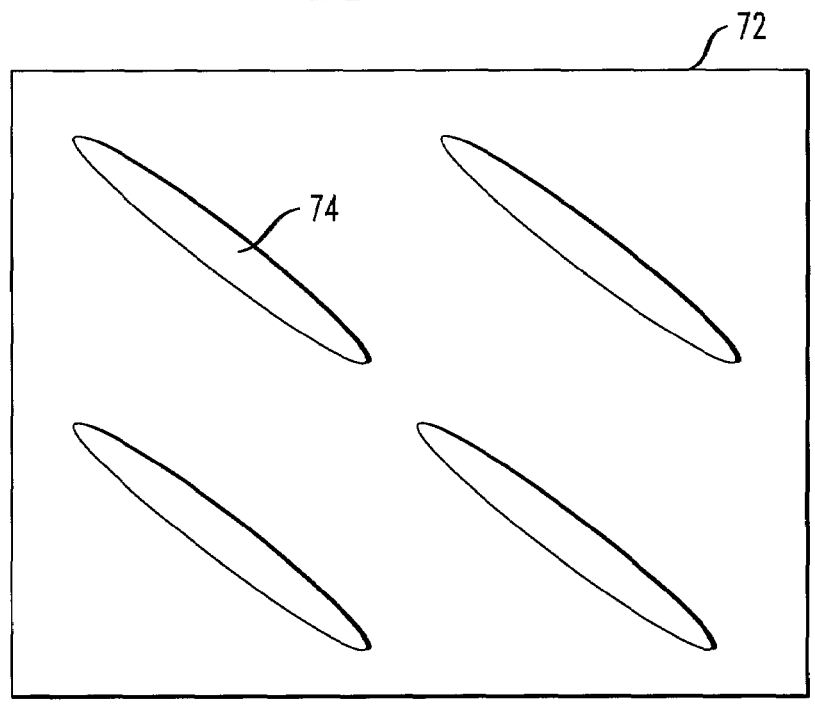
FIG. 7 is a top-down view depicting an exemplary carrier having elongated openings, formed in accordance with an embodiment of the present invention.

The openings in the carrier may have various shapes and dimensions. For example, FIG. 7 is a diagram illustrating a top-down view of a carrier having elongated openings. Namely, in FIG. 7, carrier 72 has elongated openings 74. Elongated openings 74 may comprise long slots, or some other high aspect ratio oval shaped openings with the longest dimension of which being greater than the diameter of the elastomeric bump being injected into it.

Figure 8:
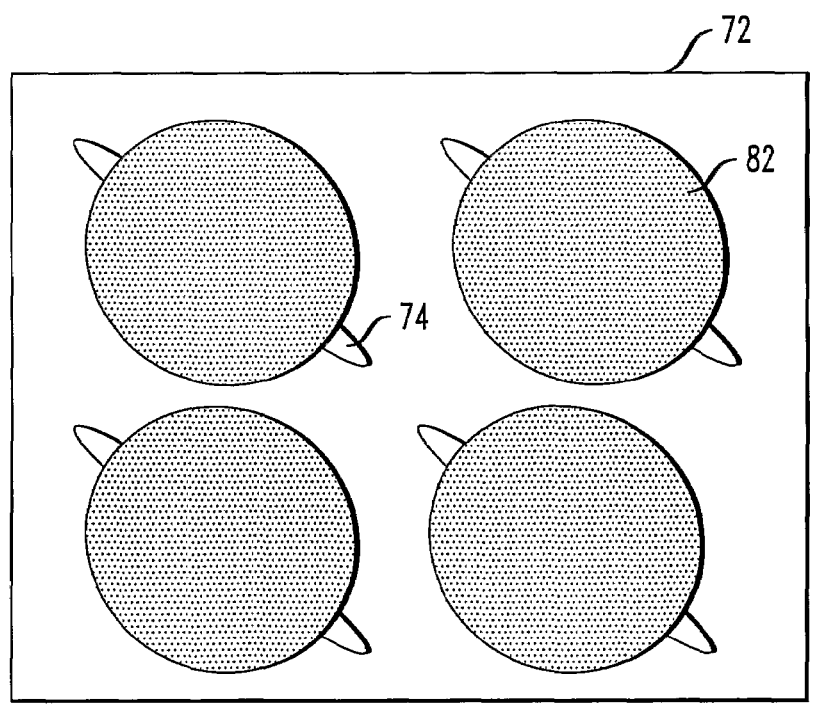
FIG. 8 is a top-down view depicting an exemplary array of elastomeric bumps formed on a carrier having elongated openings, formed in accordance with an embodiment of the present invention.

FIG. 8 is a diagram illustrating a top-down view of an exemplary array of elastomeric bumps formed on a carrier having elongated openings. As shown in FIG. 8, elastomeric material is injected onto and through carrier 72 to form elastomeric bumps 82 and corresponding elastomeric bumps on the opposing surface of carrier 72 (not shown) connected by elongated openings 74. This configuration provides a continuous surface along the entire vertical profile of the elastomeric bumps for subsequent metallization.

Figure 9:
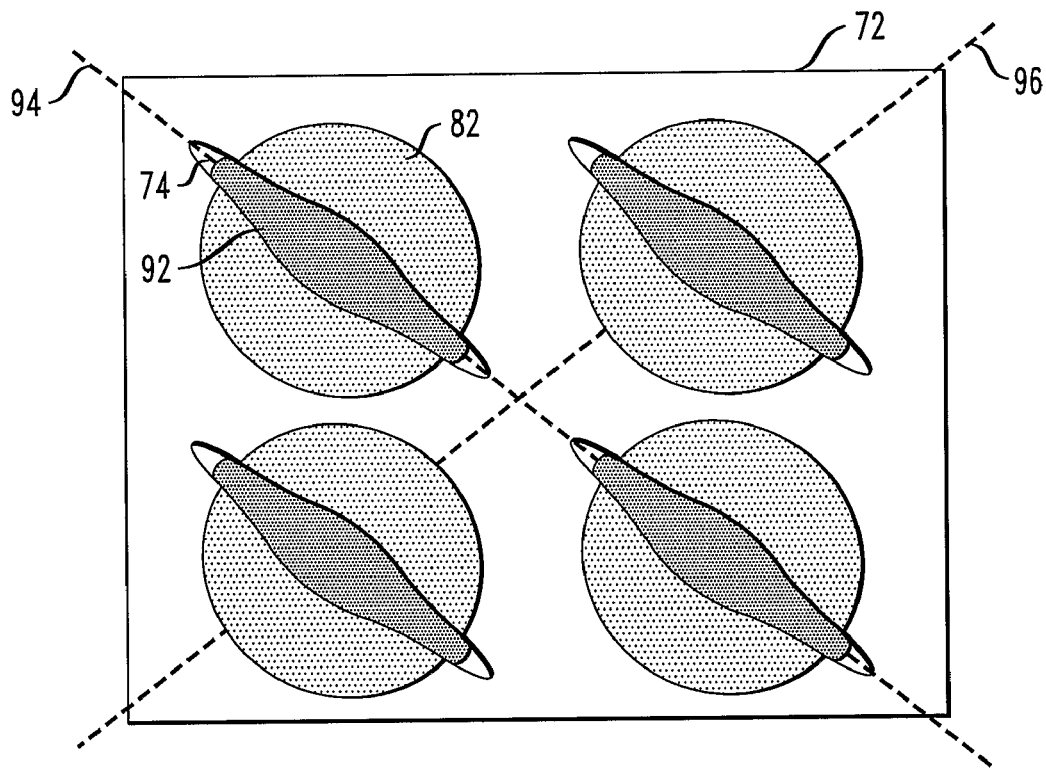
FIG. 9 is a top-down view depicting an exemplary array of electrical contacts formed on a carrier having elongated openings, in accordance with an embodiment of the present invention.

FIG. 9 is a diagram illustrating a top-down view of an exemplary array of electrical contacts formed on a carrier having elongated openings. As is shown in FIG. 9, metal layer 92 extends down both sides of elastomeric bump 82, e.g., through elongated opening 74 in carrier 72.

Figure 10:
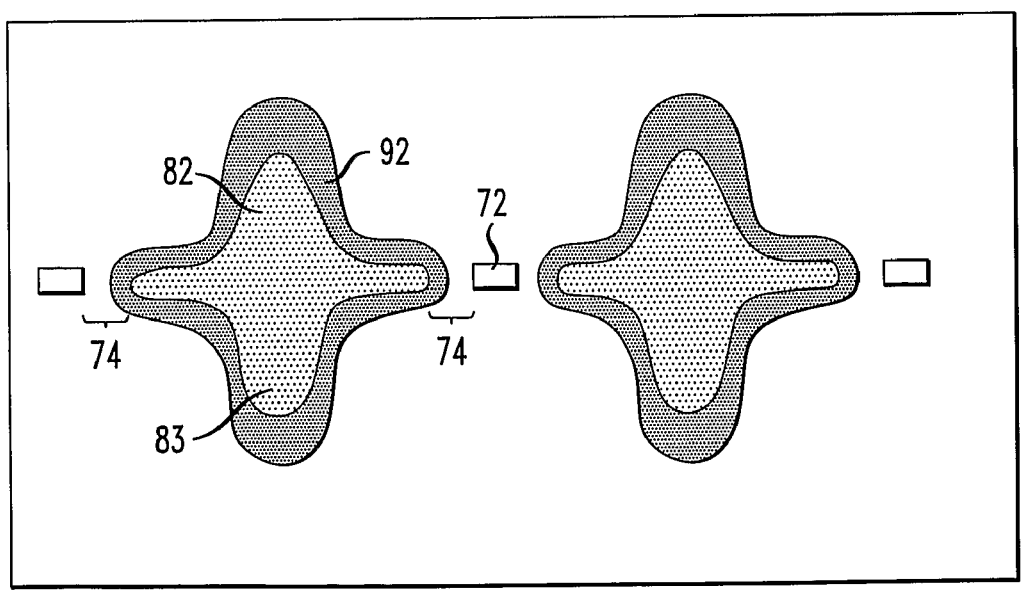
FIG. 10 is a cross-sectional view of the array of electrical contacts shown in FIG. 9, according to an embodiment of the present invention.

Dashed line 94 indicates the path of a cross-sectional view of the array shown in FIG. 10. Dashed line 96 indicates the path of a cross-sectional view of the array shown in FIG. 11.

FIG. 10 is a diagram illustrating a cross-sectional view of the array of electrical contacts shown in FIG. 9, e.g., along dashed line 94. FIG. 10 illustrates that, as described above, elastomeric bump 82 is, along with elastomeric bump 83, part of a pair of elastomeric bumps of the contact. Further, as described above in conjunction with the description of FIG. 9, metal layer 92, extends along two opposing sides of the elastomeric bumps.

One advantage of the instant exemplary embodiment is that if a seam is formed during the formation of the elastomeric bumps, then metal layer 92 can serve to traverse this seam and provide structural continuity to the contact.

Figure 11:
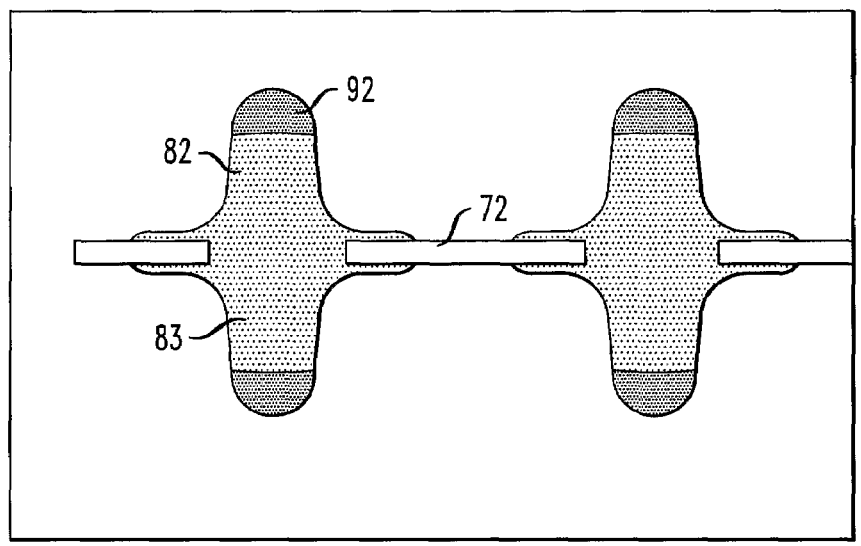
FIG. 11 is another cross-sectional view of the array of electrical contacts shown in FIG. 9, according to an embodiment of the present invention.

FIG. 11 is a diagram illustrating another cross-sectional view of the array of electrical contacts shown in FIG. 9, e.g., along dashed line 96. FIG. 11 illustrates that metal layer 92 exists on both peaks of elastomeric bumps 82 and 83.

Figure 12:
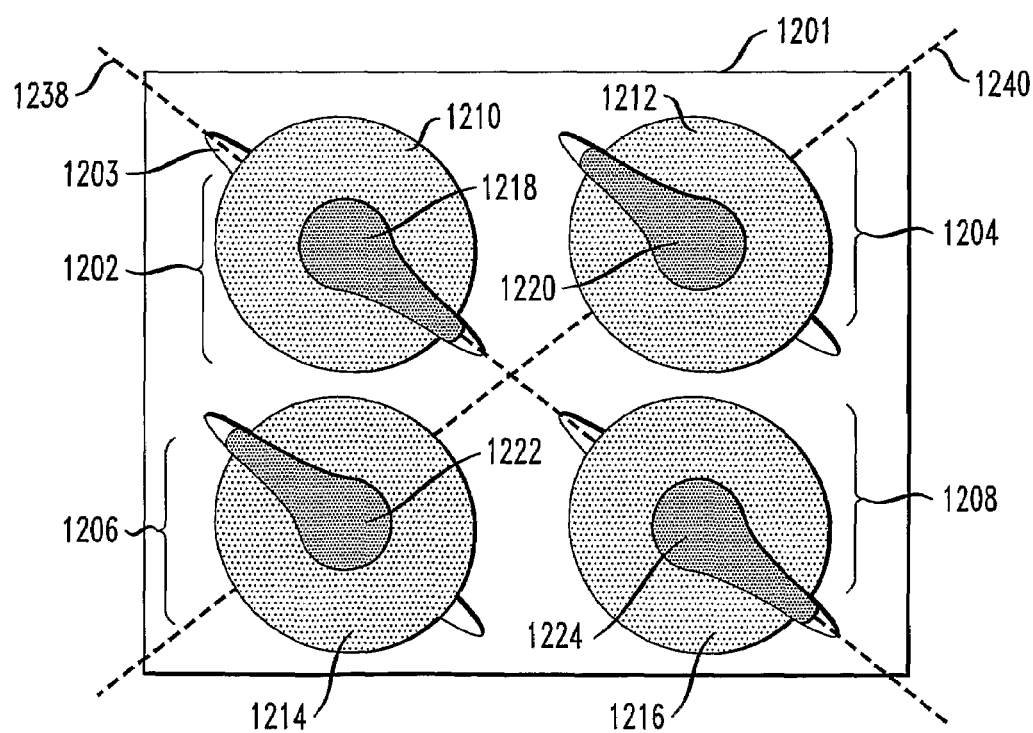
FIG. 12 is a top-down view depicting an exemplary array of electrical contacts formed on a carrier having elongated openings, in accordance with another embodiment of the present invention.

FIG. 12 is a diagram illustrating a top-down view of another exemplary array of electrical contacts formed on a carrier having elongated openings. In FIG. 12, carrier 1201 comprises contacts 1202, 1204, 1206 and 1208. Contacts 1202, 1204, 1206 and 1208 comprise elastomeric bumps 1210, 1212, 1214 and 1216, respectively. In turn, elastomeric bumps 1210, 1212, 1214 and 1216 comprise metal layers 1218, 1220, 1222 and 1224, respectively, running along only one side thereof.

The orientation of the metal layers in FIG. 12 is important to note. Namely, metal layers 1218 and 1224 run along the same facing sides of contacts 1202 and 1208 respectively, and metal layers 1220 and 1222 run along the same facing sides of contacts 1204 and 1206, respectively, but opposite to contacts 1202 and 1208.

This configuration is advantageous as the metal contacts formed are asymmetric, which can enhance lateral scrubbing of the interfaces upon use (abrasion of the interfaces to remove, for example, oxide layers, and provide a better contact) and to prevent a net force from developing in one particular direction or orientation. Regarding net forces, when a same number of metal layers, as shown in FIG. 12, or substantially a same number of metal layers point in opposing directions, the net lateral force is zero. Net forces tend to cause such connector devices to "walk," or move in one dimension laterally, and result in misalignment of the contacts, e.g., relative to the pads on a chip, over time. With this configuration, however, the direction of the lateral forces caused by vertical compression are balanced.

Figure 13:
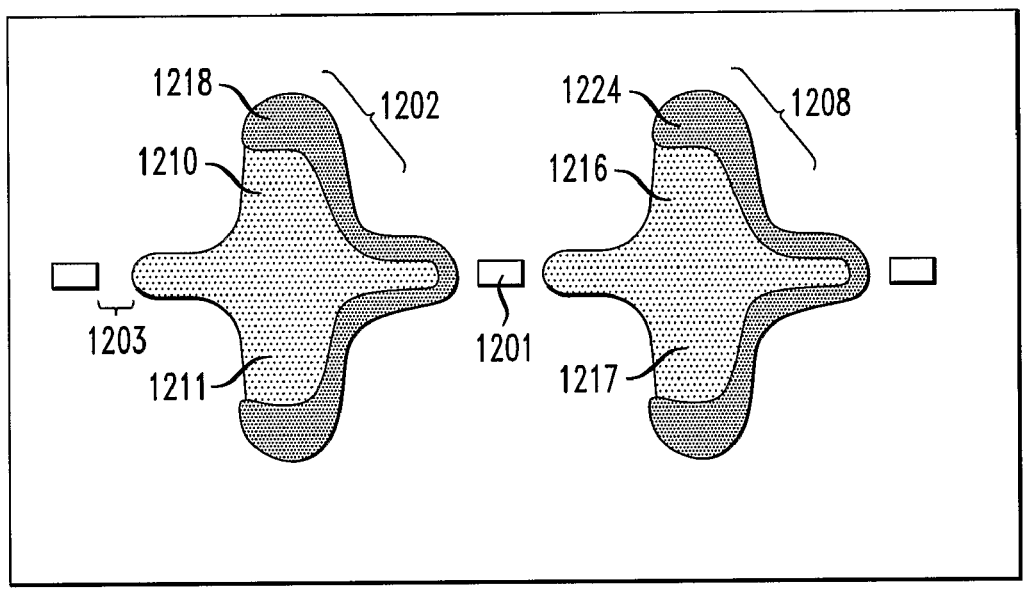
FIG. 13 is a cross-sectional view illustrating the array of electrical contacts shown in FIG. 12 taken along line 1238, according to an embodiment of the present invention.

Dashed line 1238 indicates the path of a cross-sectional view of the array shown in FIG. 13. Dashed line 1240 indicates the path of a cross-sectional view of the array shown in FIG. 14, as described below.

FIG. 13 is a diagram illustrating a cross-sectional view of the array of electrical contacts shown in FIG. 12, e.g., along dashed line 1238. FIG. 13 illustrates that, as described above, elastomeric bumps 1210 and 1216 comprise, along with elastomeric bumps 1211 and 1217, respectively, pairs of elastomeric bumps of contacts 1202 and 1208, respectively. Further, as described in conjunction with the description of FIG. 12, above, metal layers 1218 and 1224 run along a single, same facing side of each of contacts 1202 and 1208, respectively.

Figure 14:
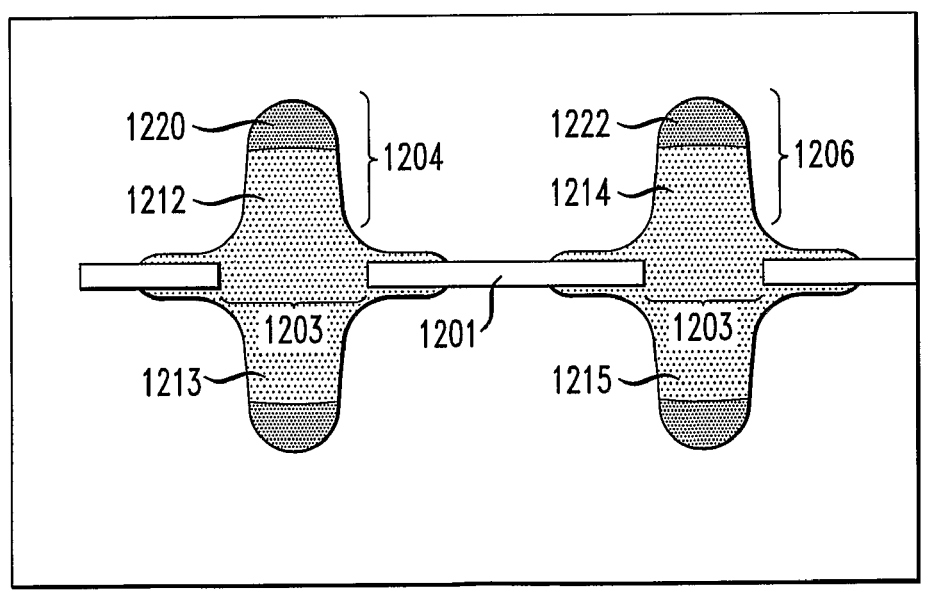
FIG. 14 is a cross-sectional view illustrating the array of electrical contacts shown in FIG. 12 taken along line 1240, according to an embodiment of the present invention.

FIG. 14 is a diagram illustrating another cross-sectional view of the array of electrical contacts shown in FIG. 12, e.g., along dashed line 1240. Similar to contacts 1202 and 1208, described in conjunction with the description of FIG. 13, above, elastomeric bumps 1212 and 1214 comprise, along with elastomeric bumps 1213 and 1215, respectively, pairs of elastomeric bumps of contacts 1204 and 1206, respectively.

Figure 15:
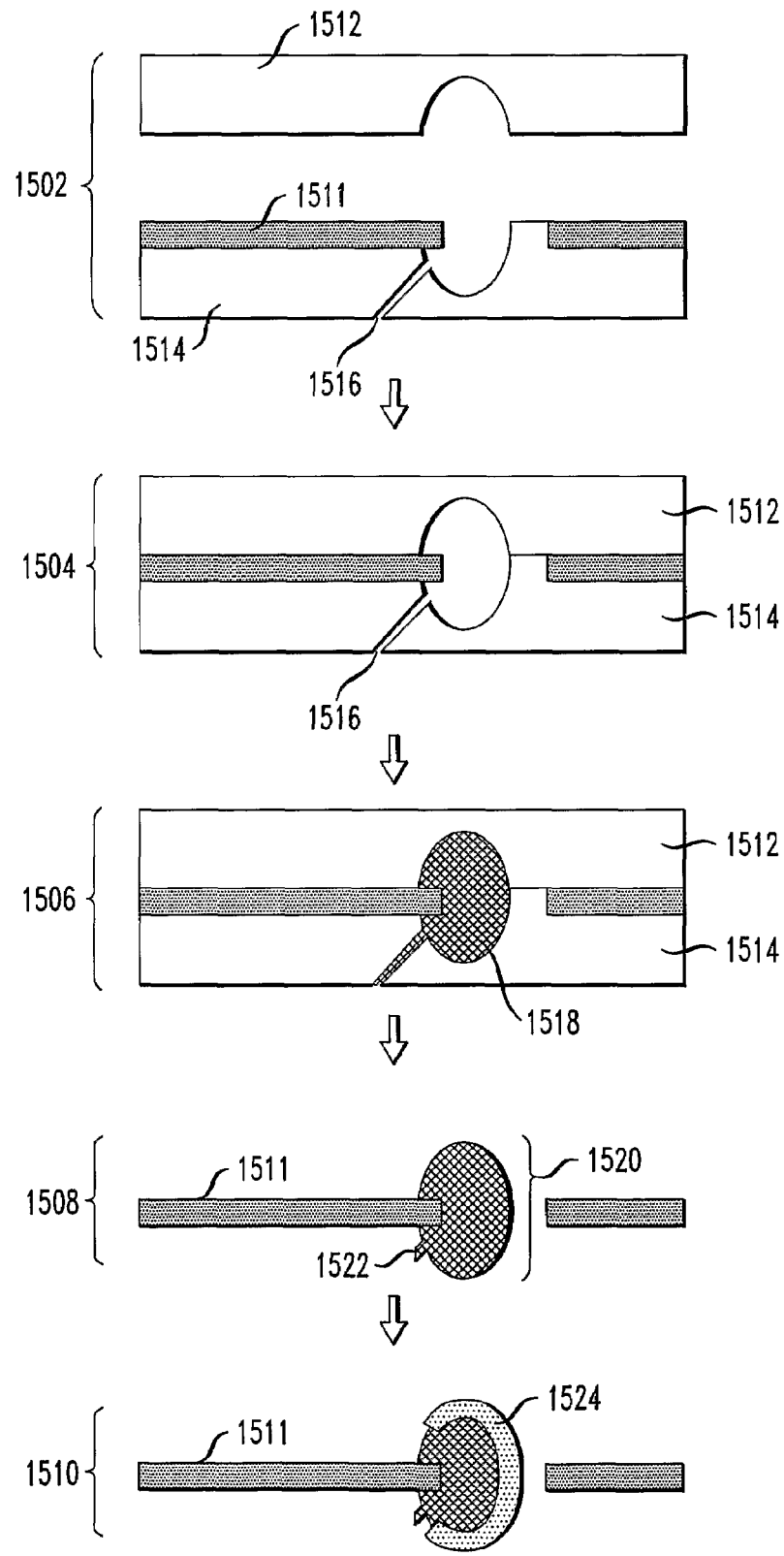
FIG. 15 is a diagram illustrating an exemplary methodology for fabricating an electrical contact on a carrier, according to an illustrative embodiment of the present invention.

FIG. 15 is a diagram illustrating an exemplary methodology for fabricating an electrical contact on a carrier. In step 1502, a mold is provided comprising a top half 1512 and a bottom half 1514, bottom half 1514 being fitted with blank carrier 1511. Bottom half 1514 of the mold also comprises injection inlet port 1516.

In step 1504, top half 1512 and bottom half 1514 of the mold are brought into alignment and in firm contact with each other. The mold is then ready to receive injection of the elastomeric material, e.g., through injection inlet port 1516.

In step 1506, elastomeric material 1518 has been injected into the mold. The elastomeric material is then allowed to react, e.g., cure, in the mold.

In step 1508, the pair of elastomeric bumps 1520 formed on carrier 1511 is released from the mold. Most of the extra elastomeric material 1518 remaining from injection inlet port, see step 1506, above, has been removed (broken off or cleaned away) leaving only a small non-uniformity 1522 on a non-critical portion of the bump. In step 1510, metallization of the molded elastomeric bumps then occurs, resulting in a continuous metal layer 1524 extending across the plain of carrier 1511.

Figure 16:
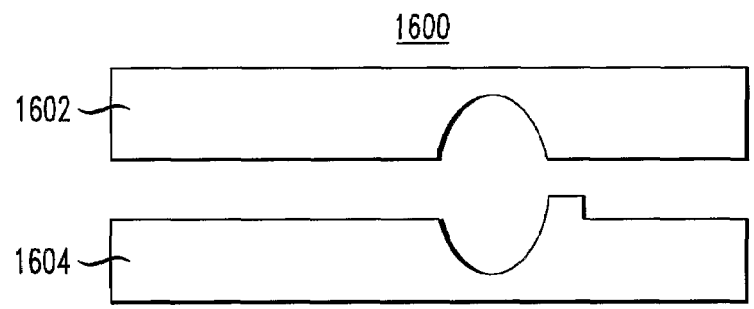
FIG. 16 is a diagram illustrating an exemplary mold for use in forming electrical contacts, according to an embodiment of the present invention.

FIG. 16 is a diagram illustrating an exemplary mold for use in forming electrical contacts. In FIG. 16, mold 1600 comprises top half 1602 and bottom half 1604. In contrast to the mold described, for example, in conjunction with the description of FIG. 15, above, mold 1600 does not contain injection inlet ports for each pair of elastomeric bumps being formed, but instead contains inlets only at the lateral edges of the mold.

Figure 17:
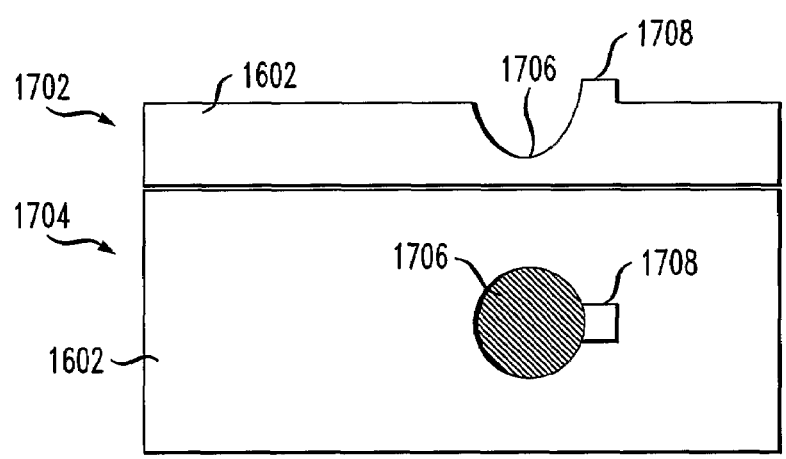
FIG. 17 is a diagram illustrating profile and top-down views of a bottom half of a mold suitable for use in forming electrical contacts, according to an embodiment of the present invention.

FIG. 17 is a diagram illustrating profile and top-down views of a bottom half of a mold for use in forming electrical contacts. Specifically, FIG. 17 illustrates profile view 1702 and top-down view 1704 of bottom half 1604 of mold 1600, described, for example, in conjunction with the description of FIG. 16, above. Both profile view 1702 and top-down view 1704 of bottom half 1604 of mold 1600 show negative relief of mold cavity 1706 and positive relief of stud 1708. Positive relief stud 1708 serves to prevent molding in that area.

Figure 18:
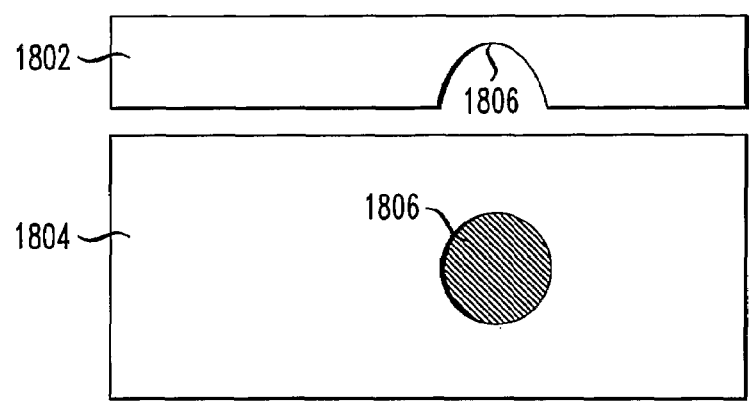
FIG. 18 is a diagram illustrating profile and top-down views of a top half of a mold suitable for use in forming electrical contacts, according to an embodiment of the present invention.

FIG. 18 is a diagram illustrating profile and top-down views of a top half of a mold for use in forming electrical contacts. Specifically, FIG. 18 illustrates profile view 1802 and top-down view 1804 of top half 1602 of mold 1600, described, for example, in conjunction with the description of FIG. 16, above. Both profile view 1802 and top-down view 1804 of top half 1602 of mold 1600 show negative relief of mold cavity 1806.

Figure 19:
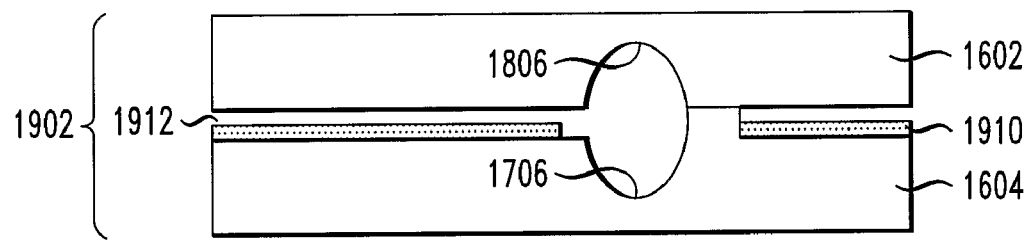
FIG. 19 is a diagram illustrating an exemplary methodology for fabricating an electrical contact on a carrier, according to another embodiment of the present invention.
Figure 19:
Figure 19:
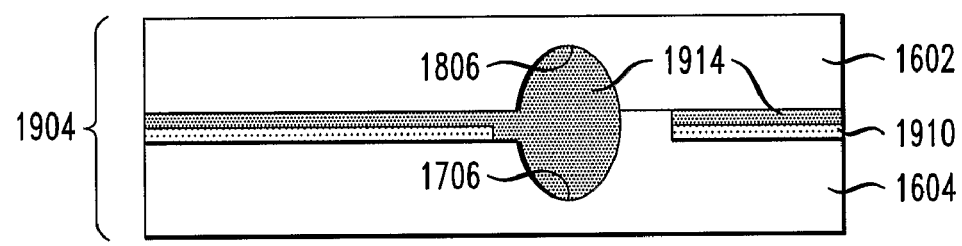
Figure 19:
Figure 19:
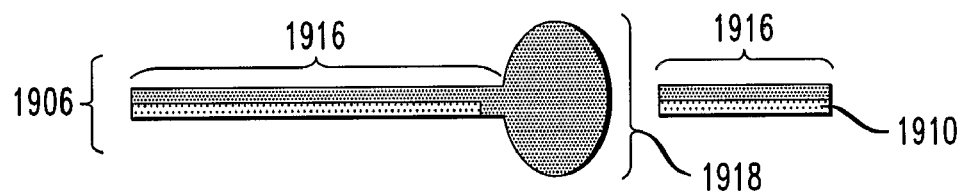
Figure 19:
Figure 19:
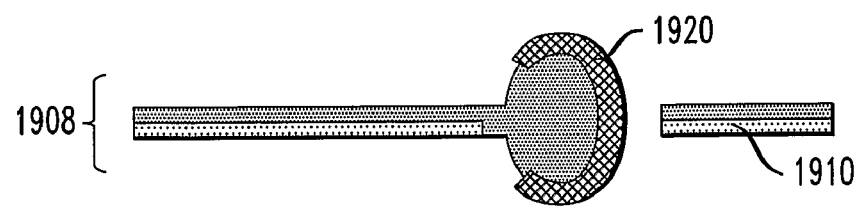

FIG. 19 is a diagram illustrating another exemplary methodology for fabricating an electrical contact on a carrier. In step 1902 a mold is provided, for example, mold 1600 described in conjunction with the description of FIG. 16, above, and comprising upper half 1602 and lower half 1604. Upper half 1602 and lower half 1604 of the mold are aligned and in contact with each other and have carrier 1910 positioned therebetween. Carrier 1910 occupies much of the space not occupied by cavities 1706 and 1806 of the mold. Empty volume 1912 constitutes the remaining gap between upper half 1602 and lower half 1604 of the mold.

In step 1904, elastomeric material 1914 has been injected into all empty areas between upper half 1602 and lower half 1604 of the mold, including cavities 1706 and 1806, gap 1912 and permeable volumes within carrier 1910. This helps anchor the elastomeric material to the carrier and also stabilizes the carrier plane, especially when the carrier comprises a material such as woven glass.

In step 1906, the resulting monolithic molding comprising elastomeric bumps 1918 is released from the mold. The molding will comprise sections 1916 reinforced by carrier 1910, which help prevent distortions of the molding. In step 1908, metallization of the elastomeric bumps then occurs, resulting in a continuous metal layer 1920 extending across the plain of carrier 1910.

In addition to the contacts described herein being employed in an LGA interposer device, they may also be employed in a wafer probe or module probe interconnection device. Wafer probing generally involves the process of testing the electrical function of integrated circuit chips while still at the wafer stage, e.g., on an intact, non-diced, wafer. During wafer probing, the wafer probe interconnection device is typically connected to the input/output (IO) pads of a given chip or chips. Namely, a planar array of interconnects are needed that can simultaneously connect each IO pad to be tested (which may include all of the IO pads) in each relevant chip site to a corresponding plane of contact pads on test instrumentation. Thus, each, or a subset, of the C4 IO connections on the bottom of the wafer can be reversibly connected simultaneously to a matching array of IO connections on a test fixture. This provides a reliable, however temporary, connection which is ideal for testing purposes, e.g., to distinguish good chips sites from malfunctioning chip sites on a given wafer.

According to this embodiment of the present invention, a wafer probe structure comprises a carrier and a metallized elastomeric contact for each (or a desired subset) connection on the bottom of a wafer. The C4 connections on a wafer are typically smaller in pitch, diameter and height than LGA interposer connectors, yet substantially the same fabrication methods may be used. Some differences, however, may be useful to note.

In an LGA interposer, the contacts on a single interposer number in the hundreds to the tens of thousands, and have dimensions typically of a pitch from center to center of about one millimeter, a height of about 40 mil (1.016 millimeters) and a diameter of about 300 microns. By comparison, on a wafer probe, the total number of contacts may be in the millions, with a pitch from center to center of about 100 microns, a diameter of 50 microns and a height of 50 microns. The dimensions provided herein are merely exemplary to provide an illustrative comparison. One of ordinary skill in the art would recognize that the contact and pitch dimensions of LGA interposer connectors and wafer/chip IOs are likely to be reduced, as the overall contact count of LGA and wafer/chip IOs increases.

Further, given the very large number of IOs on a wafer, according to this embodiment, it may be useful to populate the carrier with elastomeric contacts by molding the bumps in groups, rather than making a single mold with the total number of buttons.

In addition, as the contact or IO dimensions become smaller, the method of fabricating the mold itself may change. For example, with contact diameters on the order of 0.5 millimeters, the mold can be fabricated by high speed automated milling machines which provide good shape and depth control. Such a milling machine would raster positions until all contact sites were completed. However, with very small contact size, it may be preferable to use photolithographic techniques to etch the cavities and features into a mold. Alternatively, laser etching or laser drilling may be used to define the mold. Further still, the molds may be made by stereolithography with either additive or subtractive methods, or a combination thereof, or by lithography, electroforming and molding (LIGA) method or other stereo fabrication methods most commonly applied to the formation of micro-electromechanical systems (MEMS)-type structures in metal or silicon or glass. The molds may also be made by embossing techniques. The molds may be made from glass or quartz to allow photo-curing of the elastomeric material after it has been injected into the mold.

Apparatus and methods for injection molding solder mounds at spacing and dimensions corresponding to the size and spacing of contacts on an integrated circuit device are described, for example, in U.S. Pat. No. 5,244,143 to Ference et al., and U.S. Pat. No. 6,708,872 B2 to Gruber et al., the disclosures of which are incorporated by referenced herein. These methods are readily applicable to form the structures of the present invention at very small sizes, spacing and dimensions.

Figure 20:
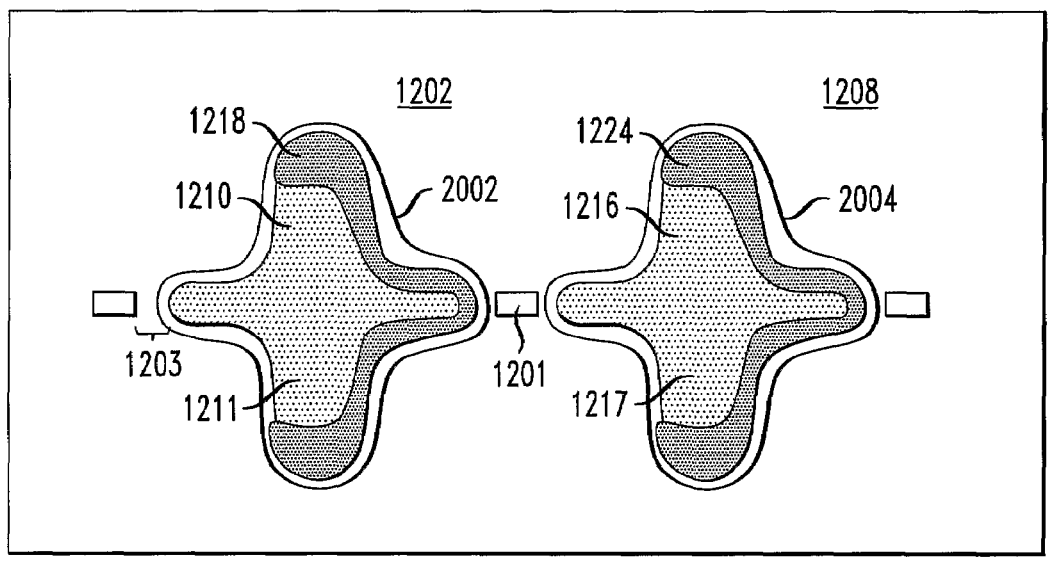
FIG. 20 is a cross-sectional view illustrating the exemplary structure of FIG. 13 having a dielectric coating deposited thereon, according to an embodiment of the present invention.

A coaxial elastomeric electrical contact can be made according to the teachings herein and as further described below. FIG. 20 illustrates the structure of FIG. 13, with contacts 1202 and 1208 thereof coated with a dielectric coating 2002 and 2004, respectively. The dielectric coating can be comprised of any suitable dielectric material, such as, for example, polymide. Methods of depositing suitable dielectric materials are known by those skilled in the art, as described, for example, in U.S. Pat. No. 6,452,406 B1 to Beaman et al., the disclosure of which is incorporated by reference herein.

Figure 21:
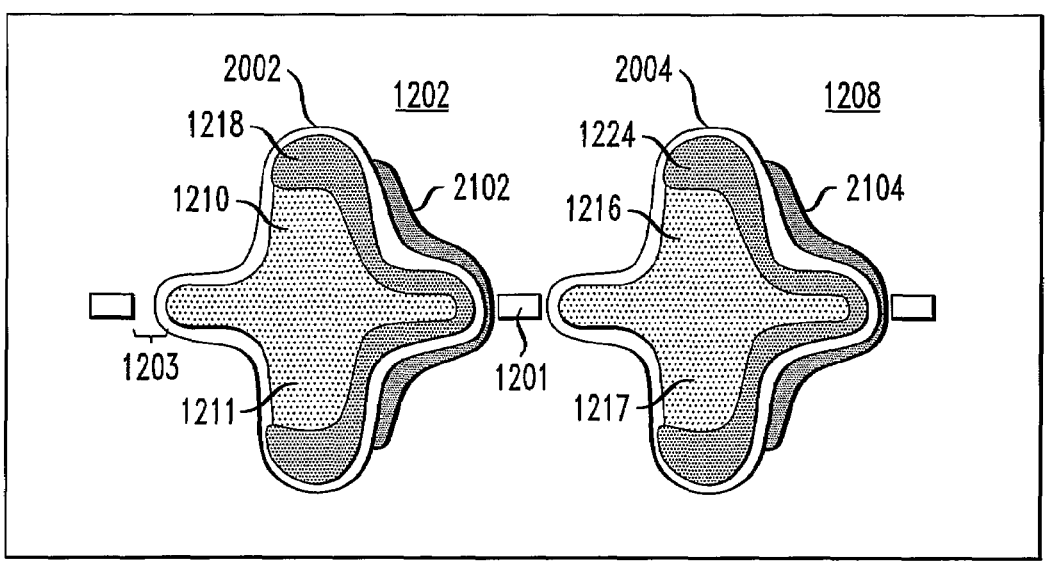
FIG. 21 is a cross-sectional view illustrating the exemplary structure of FIG. 20 having electrically conducting material deposited on the dielectric coating, according to an embodiment of the present invention.

As shown in FIG. 21, dielectric coatings 2002 and 2004 have disposed thereon electrically conducting material 2102 and 2104, respectively. Electrically conductive material 2102 and 2104 may be deposited in the same manner as electrically conductive material 1218 and 1224. Thus, electrically conductive material 2102 and 2104 can have any pattern desired.

Figure 22:
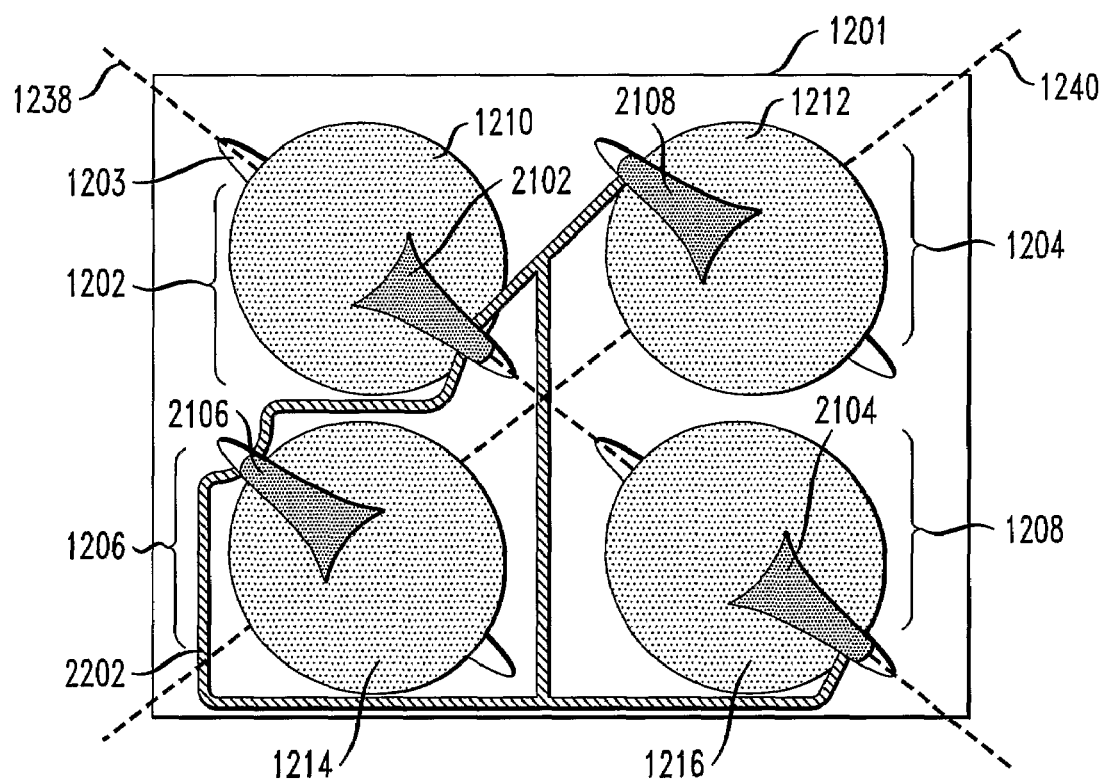
FIG. 22 is a top-down view illustrating the exemplary structure of FIG. 21 including electrically conductive patterns, according to an embodiment of the present invention.

FIG. 22 is a top down view illustrating the structure of FIG. 21. This shows electrical conductor patterns 2102 and 2104. Corresponding electrical conductors are 2106 and 2108 on contacts 1206 and 1204, respectively. The electrically conductive patterns 2102, 2104, 2106 and 2108 can be connected together as depicted in FIG. 22, although the invention is not limited to the connection arrangement shown. As apparent from the figure, electrically conductive patterns 2102, 2104, 2106 and 2108 may be connected together by electrically conductive pattern 2202 and adapted for connection to a common signal ground. Electrically conductive pattern 2202 can be formed using the same process as is used to form electrically conductive patterns 2102, 2104, 2106 and 2108. The interconnected electrical conductors 2102, 2104, 2106 and 2108 provides for a common potential, in particular ground, for each of the electrical conductors 2102, 2104, 2106 and 2108.

Figure 23:
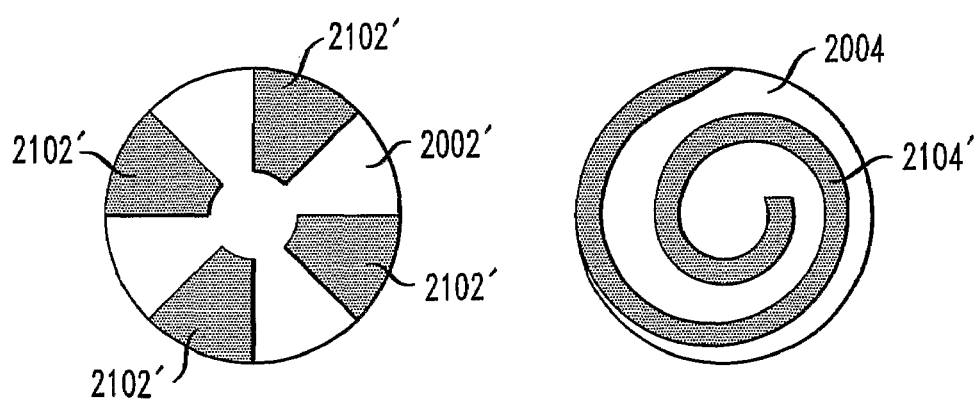
FIG. 23 is a top-down view depicting two illustrative shapes for the electrically conductive patterns shown in FIG. 22, in accordance with illustrative embodiments of the present invention.

Electrically conductive patterns, such as 2102 and 2104, can have any shape. FIG. 23 illustrates two representative shapes with a top down view as shown in FIG. 22. Pattern 2102' is in a radial spoke pattern and pattern 2104' is a helical pattern. Any other pattern can be used.

Figure 24:
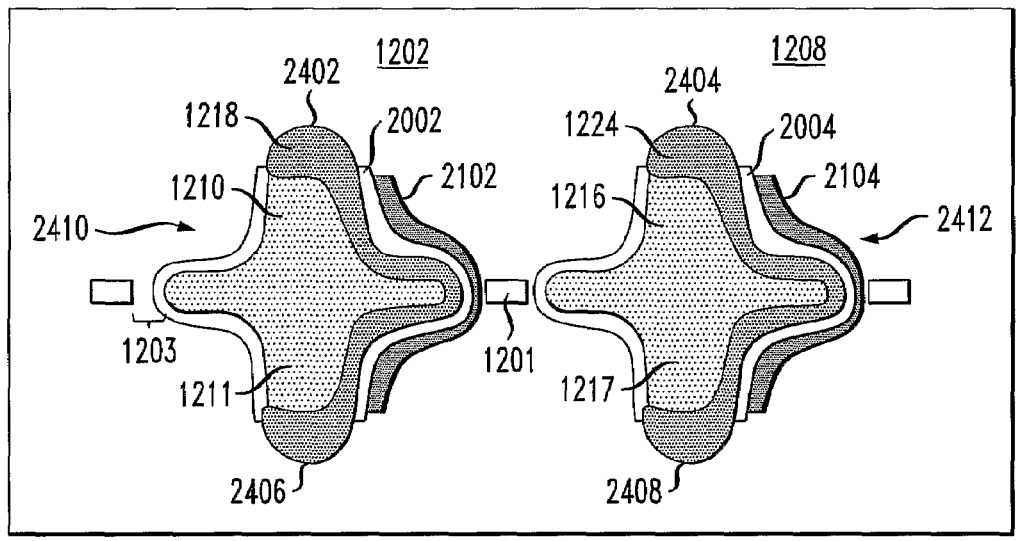
FIG. 24 is a cross-sectional view depicting the exemplary structures of FIG. 21 having certain portions of the dielectric coating selectively removed therefrom, according to an embodiment of the present invention.

FIG. 24 shows the structures of FIG. 21 with the dielectric material 2002 and 2004 selectively removed at the tips 2402, 2404, 2406 and 2408 of the coaxial connectors 2410 and 2412 which can be used as coaxial spokes.

As taught above, the structure of FIG. 12 and other related figures can be employed as a probe for an electronic device, such as a packaging substrate of an integrated circuit chip including a semiconductor chip. Details of such use is described, for example, in U.S. Pat. No. 5,635,846 to Beaman et al., and U.S. Pat. No. 5,371,654 to Beaman et al., the disclosures of which are incorporated by reference herein. When used in a probing application, the structure of FIG. 12 and related figures may comprise one or more additional contact structures adapted for connection to a test apparatus. Selective removal of dielectric material 2002 and 2004 can be done as described in U.S. Pat. No. 6,452,406 B1 incorporated by reference above. For example, if material 2002 and 2004 is polymide, an oxygen reactive ion etching (RIE) process can be used to etch the polymide. A masking operation, similar to the masking operation used to create electrically conductive patterns 1218 and 1224 shown in FIG. 13, can be used to pattern dielectric material 2002 and 2004 of FIG. 20 to form the structure depicted in FIG. 24.

Figure 25:
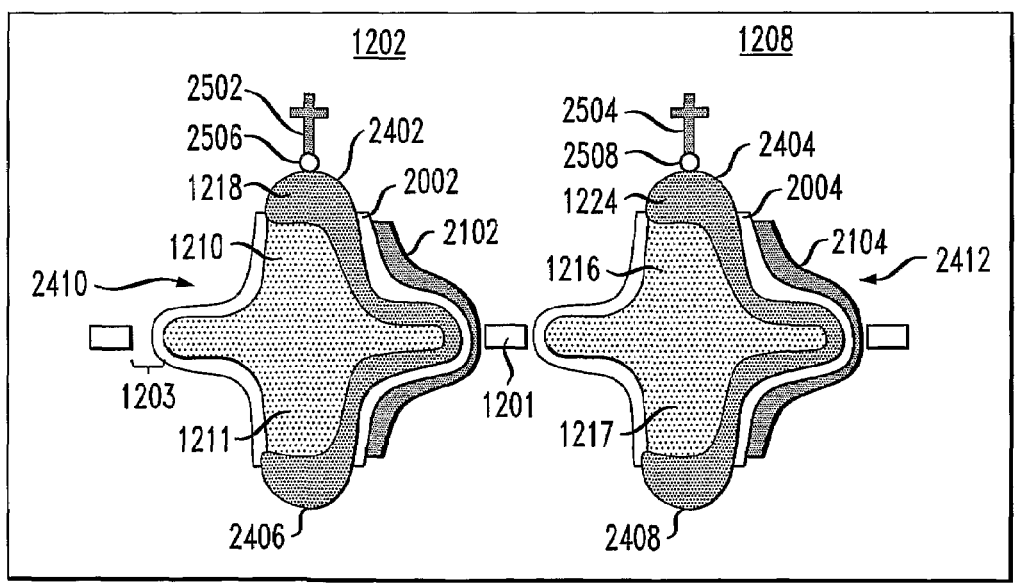
FIG. 25 is a cross-sectional view depicting the exemplary structures of FIG. 24 having probe tips formed thereon, according to an embodiment of the present invention.
Figure 26:
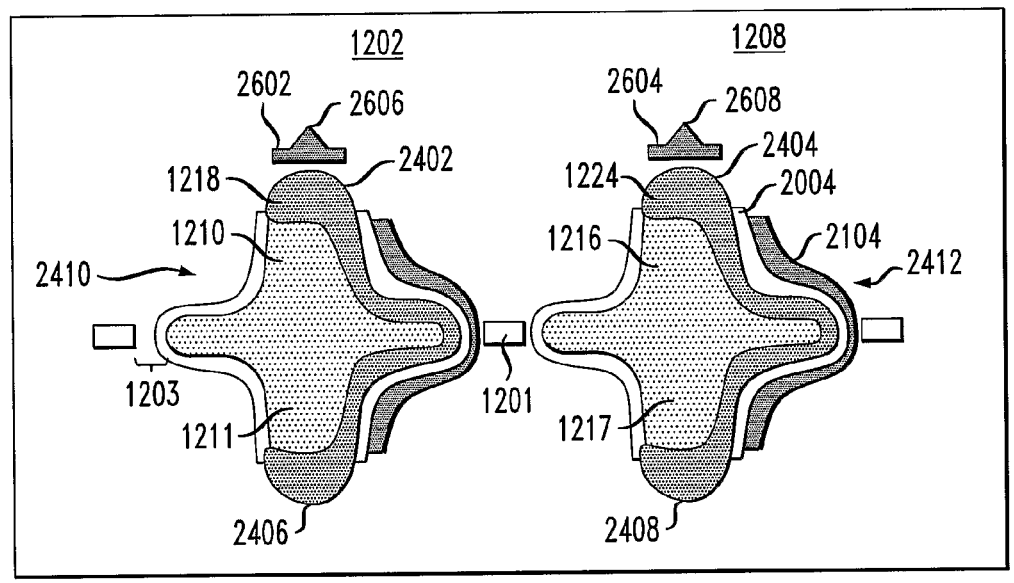
FIG. 26 is a cross-sectional view depicting the exemplary structures of FIG. 24 having pads formed thereon, according to an embodiment of the present invention.

When the structure of FIG. 24, or the non-coaxial structures such as shown in FIGS. 12 and 13, are used as probes, it is desirable to have a protuberance on the end of the structure that can break through any surface layer on the pad that is being probed so as to make good electrical contact to the probed pad. For example, with reference to FIG. 25, probe tips 2502 and 2504 can be formed and bonded to locations 2506 and 2508 of electrically conductive patterns 1218 and 1224, respectively. Probe tips 2502 and 2504 can be made, for instance, according to the teachings set forth in U.S. Pat. No. 5,371,654 incorporated by reference above and shown in FIG. 23 thereof, wherein the ends 2506 and 2508 are bonded, for example, by a wire bond solder bonder laser weld bond as shown in FIGS. 14 and 15 of U.S. Pat. No. 5,635,846 incorporated by reference above. Alternatively, as shown in FIG. 26, pads 2602 and 2604 can be bonded to ends 2402 and 2404, respectively. The pads 2602 and 2604 with spikes 2606 and 2608 can be made as described, for example, in U.S. Pat. No. 6,110,823 to Eldridge et al., the disclosure of which is incorporated by reference herein (in particular, with reference to FIG. 50b thereof).

Figure 27:
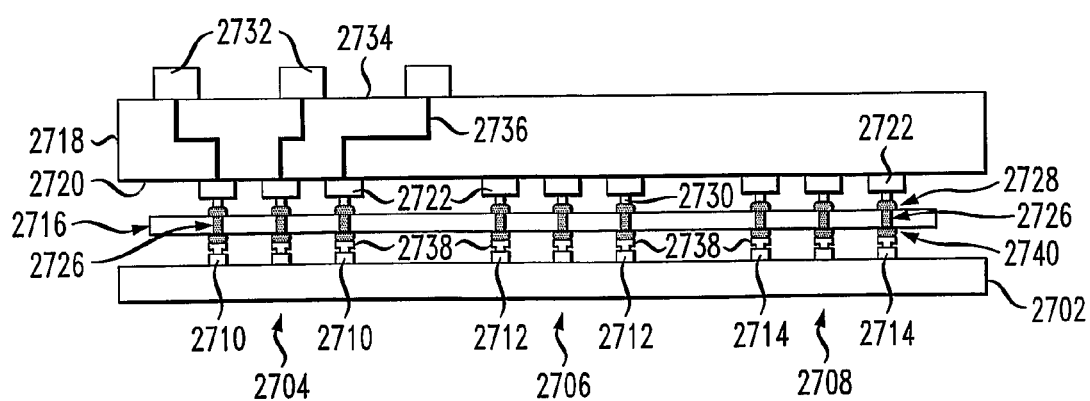
FIG. 27 is a diagram depicting an exemplary application using the conductive structures of the present invention, in accordance with an illustrative embodiment thereof.

FIG. 27 shows an illustrative configuration using the structures disclosed herein as an integrated circuit wafer probe for wafer and/or module probing (e.g., D.C. and A.C. testing) and burn-in at the wafer level. Integrated circuit wafer 2702 has a plurality of chip locations shown schematically as 2704, 2706 and 2708. Each location has a plurality of electrical contact locations 2710, 2712 and 2714. A structure 2716 according to the present invention is disposed in electrical communication with a substrate 2718. Structure 2716 has a plurality of electrical connectors 2726 according to the present invention. Substrate 2718 can be, for example, a multilevel printed circuit board (PCB) or a multilevel ceramic substrate such as is used in package semiconductor chips on multilevel substrates. These substrates are typically made from ceramic materials and can have 70 or more levels.

A first side 2720 of substrate 2718 preferably has a first plurality of electrical contact locations 2722 disposed thereon. Each of electrical connectors 2726 according to the present invention preferably has an end 2728 which is in electrical communication with a corresponding electrical contact location 2722 of substrate 2718. End 2728 can be held in electrical communication with contact location 2722, for example, by a pressure contact using a clamp (not shown) to hold structure 2716 in place with respect to first side 2720 of substrate 2718. Alternatively, end 2728 (as schematically shown) in FIG. 27 can be bonded by solder 2730, or an alternative connection arrangement, to electrical contact location 2722. Pressure bonding or solder bonding provides the advantage that structure 2716 can be easily removed from substrate 2718 if a different footprint is desired or if the structure 2716 becomes defective.

Electrical contact locations 2722 are preferably in electrical communication with a second plurality of electrical contact locations 2732 formed on a second side 2734 of substrate 2718 opposite side 2720, through electrical contact locations 2732 on side 2734 of substrate 2718, through electrically conductive patterns, shown schematically as 2736, through substrate 2718 which can provide fan out of the contact location footprint on side 2720 to a larger contact location footprint on side 2734. Electrical contact locations 2732 can be placed in electrical communication with a testing apparatus which can be through a printed circuit board to provide fan out of the electrical connections. Electrical connectors 2726, when used to contact electrical contact locations 2710, 2712 and 2714, such as in a probing operation can, as described herein, have a corresponding contact tip 2738 mounted to an end 2740 of connector 2726.

To make good electrical contact between tips 2738 and corresponding contact locations 2710, 2712 and 2714, sufficient pressure should be provided between substrate 2718 and wafer 2702. One methodology for providing such pressure between substrate 2718 and wafer 2702 suitable for use with the present invention is described, for example, in commonly owned U.S. application Ser. No. 10/928,473 filed on Aug. 27, 2004, the disclosure of which is incorporated by reference herein. Alternatively, to create a good electrical contact, tips 2738 can be laterally moved with respect to respective contact locations 2710, 2712 and 2714, such as by using vibration, as described in U.S. application Ser. No. 10/928,473, the disclosure of which was incorporated by reference above.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An electrical connecting device, comprising:
an electrically insulating carrier; and
one or more contact structures traversing a plane of the carrier, each of the one or more contact structures comprising an elastomeric material having an electrically conductive layer running along at least one surface thereof continuously through the plane of the carrier, the elastomeric material forming elastomeric bumps on opposing surfaces of the carrier;

wherein the carrier comprises one or more openings adapted to permit at least one of the elastomeric material and the electrically conductive layer to traverse the plane of the carrier, and wherein at least one of the one or more contact structures further comprises:

an insulating layer formed on at least a portion of the electrically conductive layer, the insulating layer running continuously through the plane of the carrier; and a second electrically conductive layer formed on at least a portion of the insulating layer, the second electrically conductive layer running continuously through the plane of the carrier.

* * * * *